(12) United States Patent
Fukunaga

(10) Patent No.: US 6,195,373 B1
(45) Date of Patent: Feb. 27, 2001

(54) INDEX OPTICAL WAVEGUIDE SEMICONDUCTOR LASER

(75) Inventor: Toshiaki Fukunaga, Kanagawa-ken (JP)

(73) Assignee: Fuji Photo Film Co., Ltd, Kangawa-ken (JP)

( * ) Notice: Subject to any disclaimer, the term of this patent is extended or adjusted under 35 U.S.C. 154(b) by 0 days.

(21) Appl. No.: 09/161,700

(22) Filed: Sep. 29, 1998

(30) Foreign Application Priority Data

Sep. 30, 1997 (JP) ..................................................... 9-266566

(51) Int. Cl.⁷ ...................................................... H01S 5/20
(52) U.S. Cl. ................................................. 372/45; 372/46
(58) Field of Search ........................................ 372/45, 46

(56) References Cited

U.S. PATENT DOCUMENTS 5,355,384 * 10/1994 Inoue et al. ............................. 372/45
6,118,799 * 9/2000 Okubo et al. .......................... 372/46
6,118,800 * 9/2000 Kidoguchi et al. .................... 372/46

OTHER PUBLICATIONS

"8 W continuous wave front–facet power from broad–waveguide Al–free 980 nm diode lasers", Mawst et al, Applied Physics Letters, vol. 69 (Sep. 1996) pp. 1532–1534.

"High–Power InGaAs(P)InGa(Al)P/GaAs Semiconductor Diode Lasers", Mawst et al, SPIE Proc., vol. 3001 (1997), pp. 7–12 (No month).

* cited by examiner

*Primary Examiner*—James W. Davie
(74) *Attorney, Agent, or Firm*—Sughrue, Mion, Zinn, Macpeak & Seas, PLLC

(57) ABSTRACT

An index optical waveguide semiconductor laser is formed by a lower clad layer, a lower optical waveguide layer, an active layer, an upper optical waveguide layer and an upper clad layer superposed one on another in this order on a GaAs substrate. Each of the upper and lower clad layers and the upper and lower optical waveguide layers is of a composition which matches with the GaAs substrate in lattice. The upper optical waveguide layer is formed by an $In_{x2}(Al_{z2}Ga_{1-z2})_{1-x2}As_{1-y2}P_{y2}$ ($1 \geq y2 \geq 0.8$) optical waveguide layer and a $Ga_{1-z1}Al_{z1}As$ optical waveguide layer formed on the upper surface of the $In_{x2}(Al_{z2}Ga_{1-z2})_{1-x2}As_{1-y2}P_{y2}$ optical waveguide layer. The difference in the refractive index to light at the oscillation wavelength of the semiconductor laser between the $In_{x2}(Al_{z2}Ga_{1-z2})_{1-x2}As_{1-y2}P_{y2}$ optical waveguide layer and the $Ga_{1-z1}Al_{z1}As$ optical waveguide layer is not larger than 2% of the larger of the refractive indexes of the optical waveguide layers.

15 Claims, 3 Drawing Sheets

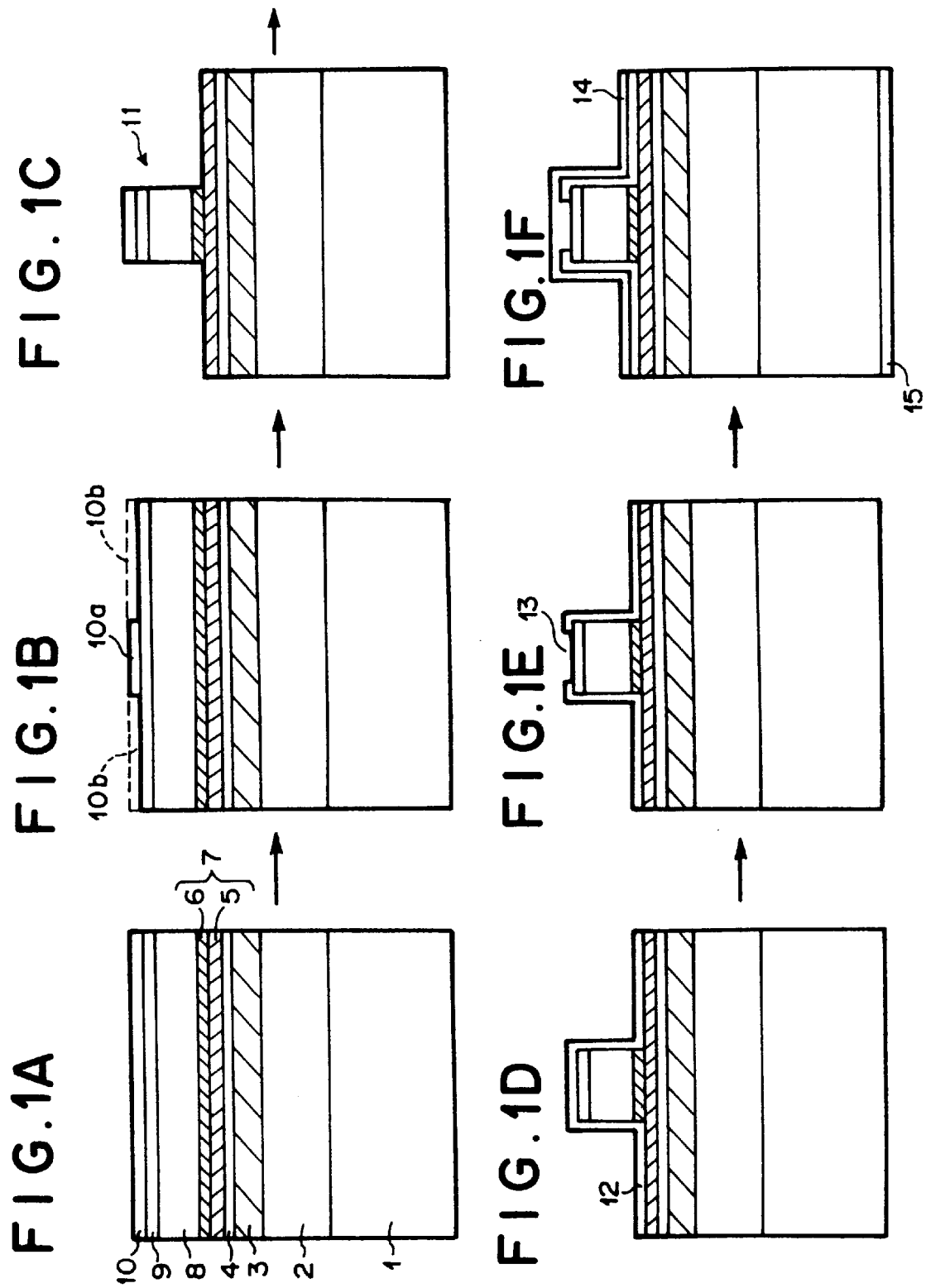

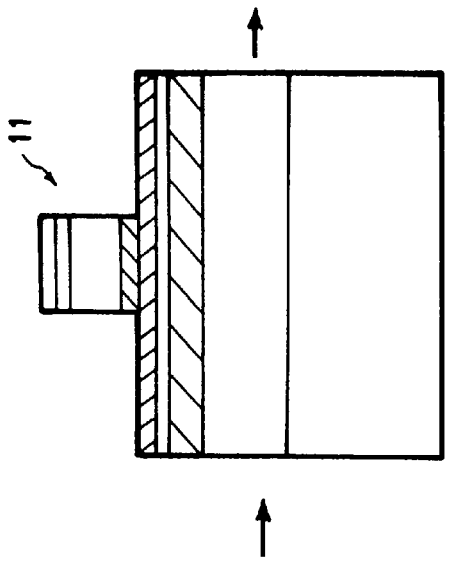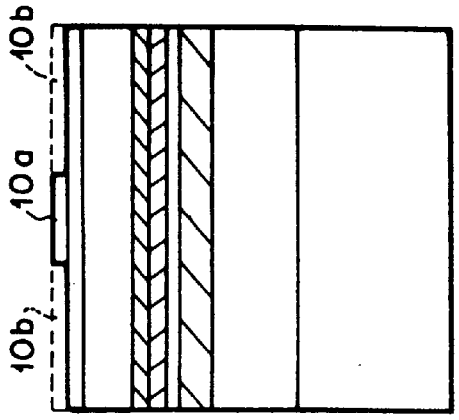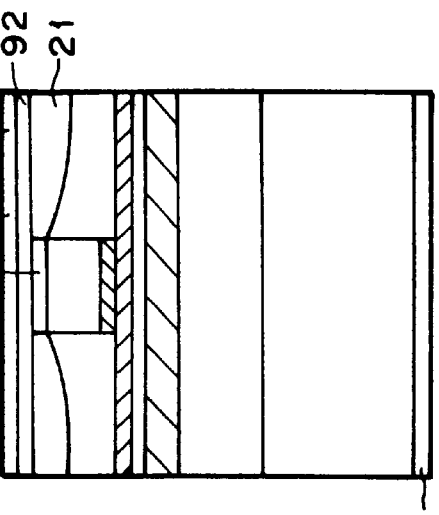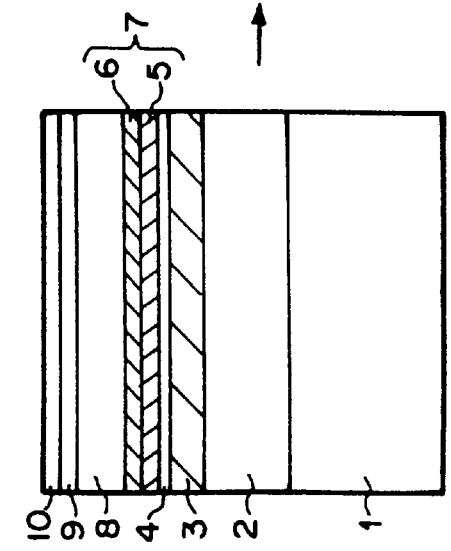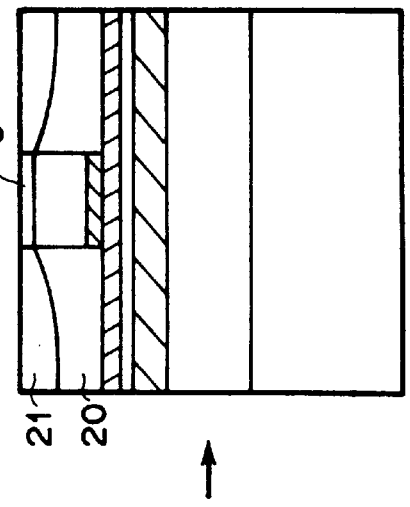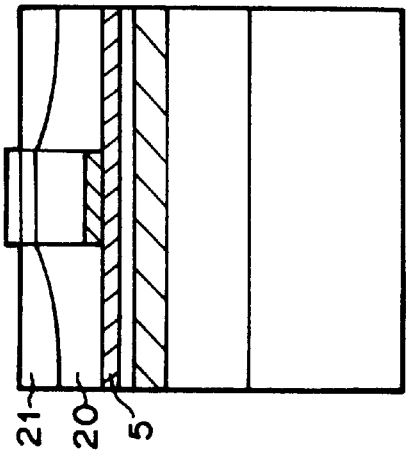

INDEX OPTICAL WAVEGUIDE SEMICONDUCTOR LASER

BACKGROUND OF THE INVENTION

1. Field of the Invention

This invention relates to a semiconductor laser, and more particularly to a composition of a semiconductor layer for forming a index optical waveguide semiconductor laser.

2. Description of the Related Art

Recently semiconductor lasers have come to be wide used in light communication, optical discs, laser printers and the like. Advent of high output semiconductor lasers not lower than 1W has realized application of semiconductor lasers to sublimation of dye by use of a laser spot as a high density heat source or to image forming, processing of material or soldering by use of laser ablation.

There have been made various attempts to make more stable a semiconductor laser and to increase output power of a semiconductor laser. For instance, as disclosed in "Applied Physics Letters", Vol. 69(1996) pp. 1532 to 1534, there has been proposed a 980 nm band semiconductor laser comprising an n-InGaP clad layer, an InGaAsP optical waveguide layer, an InGaAs strained double quantum-well active layer, an InGaAsP optical waveguide layer, a p-InGaP clad layer, and a p-GaAs cap layer formed on an n-GaAs substrate. In this semiconductor laser, the thicknesses of the optical waveguide layers are increased to reduce internal loss and to reduce the density of light in the active layer, thereby obtaining a light output of 8W for a stripe width of 100 μm.

As a semiconductor laser in which the output power is increased by increasing thickness of the optical waveguide layer, there have been reported in "SPIE Proc., Vol. 3001 (1997), pp. 7–12" a semiconductor laser having an active layer formed of InGaAsP and an optical waveguide layer and a clad layer formed of InGaAlP and a 810 nm band semiconductor laser which comprises an InGaAsP active layer, an InGaP optical waveguide layer, an n-$In_{0.5}Ga_{0.25}Al_{0.25}P$ clad layer, a p-$In_{0.5}Ga_{0.25}Al_{0.25}P$ first upper clad layer, a p-$In_{0.5}Ga_{0.45}Al_{0.05}P$ second upper clad layer, and a p-AlGaAs carrier blocking layer disposed in a boundary region of the first and second upper clad layers.

In a semiconductor laser, an index optical waveguide structure such as a ridge structure is generally formed in order to control the fundamental transverse mode. The index optical waveguide structure is formed by etching the epitaxial layer on each side of the ridge stripe up to a certain depth of the upper clad layer or the optical waveguide layer with the upper clad layer or the optical waveguide layer left there in a certain thickness. Since the oscillation mode is governed by the thickness of the upper clad layer or the optical waveguide layer left there, the depth of etching must be carefully controlled. However in the high output semiconductor lasers described above, it is very difficult to stop etching at a desired depth in forming the index optical waveguide structure due to their arrangement of the semiconductor layers. Accordingly, it is difficult to manufacture a high output semiconductor laser oscillating in a controlled transverse mode at a high repeatability.

SUMMARY OF THE INVENTION

In view of the foregoing observations and description, the primary object of the present invention is to provide a high output power index optical waveguide semiconductor laser which oscillates in a controlled transverse mode and can be manufactured at a high repeatability.

In accordance with a first aspect of the present invention, there is provided an index optical waveguide semiconductor laser comprising a lower clad layer, a lower optical waveguide layer, an active layer, an upper optical waveguide layer and an upper clad layer superposed one on another in this order on a GaAs substrate, wherein the improvement comprises that each of the upper and lower clad layers and the upper and lower optical waveguide layers is of a composition which matches with the GaAs substrate in lattice, the upper optical waveguide layer comprises an $In_{x2}(Al_{z2}Ga_{1-z2})_{1-x2}As_{1-y2}P_{y2}$ ($1 \geq y2 \geq 0.8$) optical waveguide layer and a $Ga_{1-z1}Al_{z1}As$ optical waveguide layer formed on the upper surface of the $In_{x2}(Al_{z2}Ga_{1-z2})_{1-x2}As_{1-y}2P_{y2}$ optical waveguide layer, and the difference in the refractive index to light at the oscillation wavelength of the semiconductor laser between the $In_{x2}(Al_{z2}Ga_{1-z2})_{1-x2}As_{1-y2}P_{y2}$ optical waveguide layer and the $Ga_{1-z1}Al_{z1}As$ optical waveguide layer is not larger than 2% of the larger of the refractive indexes of the optical waveguide layers.

The expression "the difference in the refractive index to light at the oscillation wavelength of the semiconductor laser between the $In_{x2}(Al_{z2}Ga_{1-z2})_{1-x2}As_{1-y2}P_{y2}$ optical waveguide layer and the $Ga_{1-z1}Al_{z1}As$ optical waveguide layer is not larger than 2% of the larger of the refractive indexes of the optical waveguide layers" should be interpreted to mean that the indexes of the optical waveguide layers to light at the oscillation wavelength of the semiconductor laser are equal to each other or slightly differ from each other (difference therebetween is 2% at most).

Preferably the difference in the refractive index is not larger than 1% of the larger of the refractive indexes of the optical waveguide layers.

In accordance with a second aspect of the present invention, there is provided an index optical waveguide semiconductor laser comprising a lower clad layer, a lower optical waveguide layer, an active layer, an upper optical waveguide layer and an upper clad layer superposed one on another in this order on a GaAs substrate, wherein the improvement comprises that each of the upper and lower clad layers and the upper and lower optical waveguide layers is of a composition which matches with the GaAs substrate in lattice, the upper optical waveguide layer comprises a $Ga_{1-z1}Al_{z1}As$ optical waveguide layer and an $In_{x6}(Al_{z6}Ga_{1-z6})_{1-x6}P$ optical waveguide layer formed on the upper surface of the $Ga_{1-z1}Al_{z1}As$ optical waveguide layer, and the difference in the refractive index to light at the oscillation wavelength of the semiconductor laser between the $Ga_{1-z1}Al_{z1}As$ optical waveguide layer and the $In_{x6}(Al_{z6}Ga_{1-z6})_{1-x6}P$ optical waveguide layer is not larger than 2% of the larger of the refractive indexes of the optical waveguide layers.

In accordance with a third aspect of the present invention, there is provided an index optical waveguide semiconductor laser comprising a lower clad layer, a lower optical waveguide layer, an active layer, an upper optical waveguide layer and an upper clad layer superposed one on another in this order on a GaAs substrate, wherein the improvement comprises that each of the upper and lower clad layers and the upper and lower optical waveguide layers is of a composition which matches with the GaAs substrate in lattice, the upper optical waveguide layer comprises an $In_{x2}(Al_{z2}Ga_{1-z2})_{1-x2}As_{1-y2}P_{y2}$ ($1 \geq y2 \geq 0.8$) optical waveguide layer, a $Ga_{1-z1}Al_{z1}As$ optical waveguide layer formed on the upper surface of the $In_{x2}(Al_{z2}Ga_{1-z2})_{1-x2}As_{1-y2}P_{y2}$ optical waveguide layer, and an $In_{x6}(Al_{z6}Ga_{1-z6})_{1-x6}P$ optical waveguide layer formed on the upper surface of the $Ga_{1-z1}Al_{z1}As$ optical waveguide layer, the difference in the refractive index to light at the oscillation wavelength of the semiconductor laser among the $In_{x2}(Al_{z2}Ga_{1-z2})_{1-x2}As_{1-y2}P_{y2}$ optical waveguide layer, the $Ga_{1-z1}Al_{z1}As$ optical waveguide layer and the $In_{x6}(Al_{z6}Ga_{1-z6})_{1-x6}P$ optical waveguide layer is not larger than 2% of the largest of the refractive indexes of the three optical waveguide layers.

The expression "the difference in the refractive index to light at the oscillation wavelength of the semiconductor laser among the $In_{x2}(Al_{z2}Ga_{1-z2})_{1-x2}As_{1-y2}P_{y2}$ optical waveguide layer, the $Ga_{1-z1}Al_{z1}As$ optical waveguide layer and the $In_{x6}(Al_{z6}Ga_{1-z6})_{1-x6}P$ optical waveguide layer is not larger than 2% of the largest of the refractive indexes of the three optical waveguide layers" should be interpreted to mean that the indexes of all the three optical waveguide layers to light at the oscillation wavelength of the semiconductor laser are equal to each other or slightly differ from each other (difference therebetween is 2% at most).

Preferably the difference in the refractive index is not larger than 1% of the largest of the refractive indexes of the optical waveguide layers.

In the semiconductor lasers of the first to third aspects of the present invention, each of the semiconductor layers may be of a single layer or a plurality of layers. When each of the upper and lower clad layers and the upper and lower optical waveguide layers is of a plurality layers, each layer should be of a composition which matches with the GaAs substrate in lattice.

It is preferred that the active layer be of $In_{x3}Ga_{1-x3}As_{1-y3}P_{y3}$, the lower clad layer be of an n-type and the upper clad layer be of a p-type.

The compositional variables such as x2, x6, z1, z2 and z6 for the clad layers and the optical waveguide layers can take any value from 0 to 1 inclusive so long as the resulting composition matches with the GaAs substrate in lattice. The compositional variables x3 and ys for the active layer can take any value from 0 to 1 inclusive so long as the resulting composition has a band gap which can produce a laser osxillation at 750 to 1100 nm.

Further it is preferred that the total thickness of the upper and lower optical waveguide layers be 0.6 μm to 1.6 μm.

Further it is preferred that the upper and lower optical waveguide layers be of substantially the same thickness.

Preferably the difference in the refractive index to light at the oscillation wavelength of the semiconductor laser between the upper and lower clad layers is not larger than 2% of the larger of the refractive indexes of the clad layers and more preferably not larger than 1%. The refractive indexes of the clad layers may be equal to each other.

In accordance with the present invention, since the upper optical waveguide layer comprises an $In_{x2}(Al_{z2}Ga_{1-z2})_{1-x2}As_{1-y2}P_{y2}$ ($1 \geq y2 \geq 0.8$) optical waveguide layer and a $Ga_{1-z1}Al_{z1}As$ optical waveguide layer formed on the upper or lower surface of the $In_{x2}(Al_{z2}Ga_{1-z2})_{1-x2}As_{1-y2}P_{y2}$ optical waveguide layer and the refractive indexes of these optical waveguide layers are substantially the same, the upper optical waveguide layer can be relatively thick and at the same time the depth of etching, i.e., the thickness of the optical waveguide layer to be left, can be easily controlled by use of selectivity of etching to the optical waveguide layers, that is, by use of a difference between the two optical waveguide layers in etching speed at which the optical waveguide layers are etched by a given etching solution. Specifically, when the GaAlAs layer is on the upper surface of the In(AlGa)AsP layer, an etching solution comprising sulfuric acid and hydrogen peroxide is used, and etching is carried out from the GaAlAs layer side and is stopped at the In(AlGa)AsP layer. When the In(AlGa)P layer is on the upper surface of the GaAlAs layer, an etching solution comprising hydrochloric acid is used, and etching is carried out from the In(AlGa)P layer side and is stopped at the GaAlAs layer.

Since the thickness of the optical waveguide layer is increased, the output power of the semiconductor laser can be increased, and since control of the thickness of the optical waveguide layer to be left is facilitated, the index optical waveguide structure such as a ridge structure or an embedded structure can be produced at a high repeatability, whereby a high output power transverse mode-controlled semiconductor laser can be manufactured at a high repeatability.

When a $Ga_{1-z1}Al_{z1}As$ optical waveguide layer is provided on the p-type clad layer side of an active layer of $In_{x3}Ga_{1-x3}As_{1-y3}P_{y3}$, a large band offset of a conduction band can be realized and a small band offset of a valence band can be realized. Accordingly, overflow of electrons from the optical waveguide layer to the p-type clad layer can be suppressed and positive holes can be more efficiently injected from the optical waveguide layer to the p-type clad layer, which enables reduction of the drive current to suppress heat generation of the semiconductor laser and reduction in the light density in the active layer. Thus reliability when the semiconductor laser operates at a high power can be improved.

When the upper and lower optical waveguide layers are substantially the same in thickness, the emission intensity can be symmetrical near the active layer.

Further since the active layer does not include Al, the semiconductor laser of the present invention is better in durability than the conventional semiconductor lasers including Al.

BRIEF DESCRIPTION OF THE DRAWINGS

FIGS. 1A to 1F are schematic views for illustrating the steps of manufacturing a semiconductor laser in accordance with a first embodiment of the present invention, FIGS. 3A to 3F are schematic views for illustrating the steps of manufacturing a semiconductor laser in accordance with a third embodiment of the present invention.

DESCRIPTION OF THE PREFERRED EMBODIMENTS

Figure 2A:
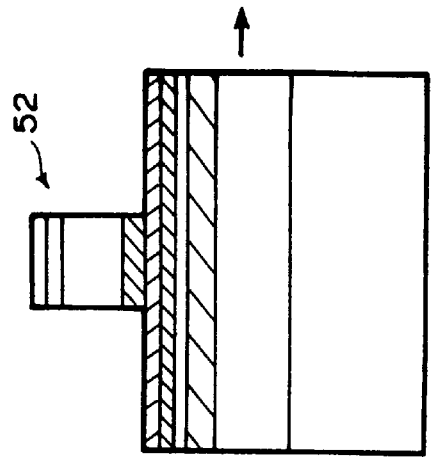
FIGS. 2A to 2F are schematic views for illustrating the steps of manufacturing a semiconductor laser in accordance with a second embodiment of the present invention.

The structure of a semiconductor laser in accordance with a first embodiment of the present invention will be described in conjunction with the procedure of forming the semiconductor laser shown in FIGS. 1A to 1F, hereinbelow.

An n-$Ga_{1-z5}Al_{z5}As$ clad layer 2, an n-$In_{x2}(Al_{z2}Ga_{1-z2})_{1-x2}As_{1-y2}P_{y2}$ ($1 \geq y2 \geq 0.8$) lower optical waveguide layer 3, an $In_{x3}Ga_{1-x3}As_{1-y3}P_{y3}$ active layer 4, an upper optical waveguide layer 7 consisting of a $In_{x2}(Al_{z2}Ga_{1-z2})_{1-x2}As_{1-y2}P_{y2}$ first optical waveguide layer 5 ($1 \geq y2 \geq 0.8$) and a p-$Ga_{1-z1}Al_{z1}As$ second optical waveguide layer 6

(z1<z5≦1), a p-$Ga_{1-z5}Al_{z5}As$ clad layer 8, and a p-GaAs contact layer 9 are formed one on another in this order on an n-GaAs substrate 1 by MOCVD, and an insulating layer 10 such as of $SiO_2$ is formed on the p-GaAs contact layer 9 as shown in FIG. 1A. The compositions of the first and second optical waveguide layers 5 and 6 of the upper optical waveguide layer 7 are selected so that the refractive index to light at the oscillation wavelength of the semiconductor laser of the second optical waveguide layer 6 is within ±1% of that of the first optical waveguide layer 5. Each of the clad layers 2 and 8 and the lower and upper optical waveguide layers 3 and 7 is of a composition which matches with the GaAs substrate 1 in lattice.

Thereafter stripe-like portions 10b (about 6 μm wide) on opposite edge portions of the insulating layer 10 is removed with a stripe 10a about 3 μm wide therebetween left there by an ordinary lithography as shown in FIG. 1B. Then the epitaxial layer on opposite sides of the stripe 10a up to the first optical waveguide layer 5, i.e., the contact layer 9, the clad layer 8 and the second optical waveguide layer 6, is removed by wet etching using the stripe 10a of the insulating layer 10 as a mask, thereby forming a ridge stripe 11 as shown in FIG. 1C. At this time, by using an etching solution comprising sulfuric acid and hydrogen peroxide, etching can be automatically stopped at the upper surface of the first optical waveguide layer 5. This is owing to a difference between the first and second optical waveguide layers 5 and 6 in etching speed at which the optical waveguide layers are etched by the sulfuric acid and hydrogen peroxide etching solution. Thus control of the thickness of the upper optical waveguide layer 7 to be left is facilitated the ridge stripe can be formed accurately at a high repeatability. The thickness of the first optical waveguide layer 5 is selected so that index optical waveguide in a single fundamental mode can be accomplished up to a high output power by the resulting ridge stripe waveguide. The total thickness of the upper and lower optical waveguide layers 3 and 7 is about 0.6 μm to 1.6 μm and the upper and lower optical waveguide layers 3 and 7 are substantially the same in thickness so that the emission intensity can be symmetrical near the active layer. By increasing the total thickness of the upper and lower optical waveguide layers 3 and 7 to such an extent to enlarge the region of optical waveguide, the light density in the active layer can be reduced and the maximum output power can be increased.

Thereafter an insulating layer 12 is formed over the exposed area of the first optical waveguide layer 5 and the ridge stripe 11 as shown in FIG. 1D, and then the insulating layer 12 on the upper surface of the ridge stripe 11 is removed by ordinary lithography, thereby forming a current injection window 13 as shown in FIG. 1E. A p-side electrode 14 is formed to cover the current injection window 13 and an n-side electrode 15 is formed on the lower surface of the substrate 1 after grinding the lower surface of the substrate 1 as shown in FIG. 1F. Then a high reflective coating is formed on one surface of the resonator surface and an untireflecting coating is formed on the other surface of the resonator, the surfaces being formed by cleavage. Then the resultant product is made into a semiconductor laser chip.

Since not including Al in the active layer 4, the semiconductor laser of this embodiment is better in durability. Further by virtue of the p-$Ga_{1-z1}Al_{z1}As$ optical waveguide layer 6 provided on the p-type clad layer 8 side of the active layer 4 of $In_{x3}Ga_{1-x3}As_{1-y3}P_{y3}$, overflow of electrons can be suppressed and positive holes can be more efficiently injected. Accordingly heat generation of the semiconductor laser can be reduced, and the semiconductor laser can emit 0.8 μm band laser beam at a high power keeping the fundamental transverse mode.

Though in the embodiment described above, the active layer is of a simple double hetero structure, it may be of a bulk or a quantum-well structure of InGaAsP material in lattice matching. When the active layer is of a quantum-well structure, it may be of a composition including compression strain and/or tensile strain. In this case, a barrier layer for compensating for the strain may be formed. Further the quantum-well layer may be of a multiquantum-well structure.

As a modification of the first embodiment, an n-$In_{x4}(Ga_{1-z4}Al_{z4})_{1-x4}As_{1-y4}P_{y4}$ clad layer may be employed in place of the n-$Ga_{1-z5}Al_{z5}As$ clad layer 2. In this case, the composition of the n-$In_{x4}(Ga_{1-z4}Al_{z4})_{1-x4}As_{1-y4}P_{y4}$ clad layer should be selected so that the refractive index of the n-$In_{x4}(Ga_{1-z4}Al_{z4})_{1-x4}As_{1-y4}P_{y4}$ clad layer to oscillation wavelength is substantially the same as that of the p-$Ga_{1-z5}Al_{z5}As$ clad layer 8.

Further the upper optical waveguide layer 7 may comprise a $Ga_{1-z1}Al_{z1}As$ optical waveguide layer and an $In_{x6}(Al_{z6}Ga_{1-z6})_{1-x6}P$ optical waveguide layer formed on the upper surface of the $Ga_{1-z1}Al_{z1}As$ optical waveguide layer. In this case, an etching solution comprising hydrochloric acid is used.

The structure of a semiconductor laser in accordance with a second embodiment of the present invention will be described in conjunction with the procedure of forming the semiconductor laser shown in FIGS. 2A to 2F, hereinbelow.

An n-$Ga_{1-z5}Al_{z5}As$ clad layer 42, an n-$In_{0.5}(Al_{z2}Ga_{1-z2})_{0.5}P$ lower optical waveguide layer 43, an $In_{x3}Ga_{1-x3}As_{1-y3}P_{y3}$ active layer 44, an upper optical waveguide layer 48 consisting of a p-$In_{0.5}(Al_{z2}Ga_{1-z2})_{0.5}P$ first optical waveguide layer 45, a p-$Ga_{1-z1}Al_{z1}As$ second optical waveguide layer 46 (z1<z5≦1) and a p-$(Al_{z2}Ga_{1-z2})_{0.5}P$ third optical waveguide layer 47, a p-$In_{0.5}(Ga_{1-z3}Al_{z3})0.5P$ clad layer 49 (1≧z3>z2), and a p-GaAs contact layer 50 are formed one on another in this order on an n-GaAs substrate 41 by MOCVD, and an insulating layer 51 such as of $SiO_2$ is formed on the p-GaAs contact layer 50 as shown in FIG. 2A. The compositions of the first to third optical waveguide layers 45 to 47 of the upper optical waveguide layer 48 are selected so that the refractive indexes to light at the oscillation wavelength of the semiconductor laser of the optical waveguide layer are substantially equal to each other (the difference therebetween is within 1%). Each of the clad layers 42 and 49 and the lower and upper optical waveguide layers 43 and 48 is of a composition which matches with the GaAs substrate 41 in lattice.

Figure 2B:
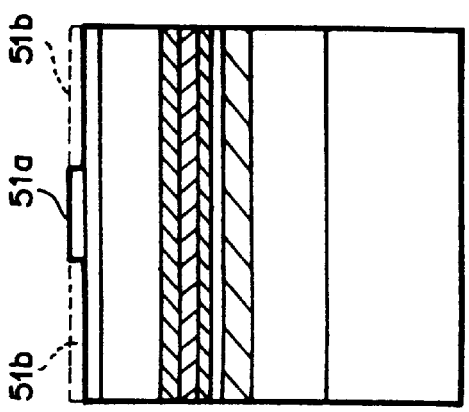
Figure 2C:
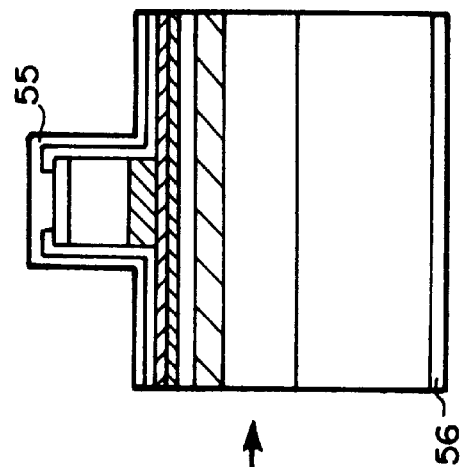

Thereafter stripe-like portions 51b (about 6 μm wide) on opposite edge portions of the insulating layer 51 is removed with a stripe 51a about 3 μm wide therebetween left there by an ordinary lithography as shown in FIG. 2B. Then the epitaxial layer on opposite sides of the stripe 51a up to the second optical waveguide layer 46, i.e., the contact layer 50, the clad layer 49 and the third optical waveguide layer 47, is removed by wet etching using the stripe 51a of the insulating layer 51 as a mask, thereby forming a ridge stripe 52 as shown in FIG. 2C. At this time, the contact layer 50 is first removed by use of an etching solution comprising sulfuric acid and hydrogen peroxide, and then the clad layer 49 and the third optical waveguide layer 47 are removed by use of an etching solution comprising hydrochloric acid. By using a hydrochloric acid etching solution, etching can be automatically stopped at the upper surface of the second optical waveguide layer 46. This is owing to a difference between the second and third optical waveguide layers 46 and 47 in etching speed at which the optical waveguide layers are etched by the hydrochloric acid etching solution. Thus the ridge stripe 52 can be formed accurately at a high repeatability. The total thickness of the first and second optical waveguide layers 45 and 47 is selected so that index optical waveguide in a single fundamental mode can be accomplished up to a high output power by the resulting ridge stripe waveguide. The total thickness of the upper and lower optical waveguide layers 43 and 48 is about 0.6 $\mu$m to 1.6 $\mu$m and the upper and lower optical waveguide layers 43 and 48 are substantially the same in thickness so that the emission intensity can be symmetrical near the active layer. By increasing the total thickness of the upper and lower optical waveguide layers 43 and 48 to such an extent to enlarge the region of optical waveguide, the light density in the active layer can be reduced and the maximum output power can be increased.

Figure 2D:
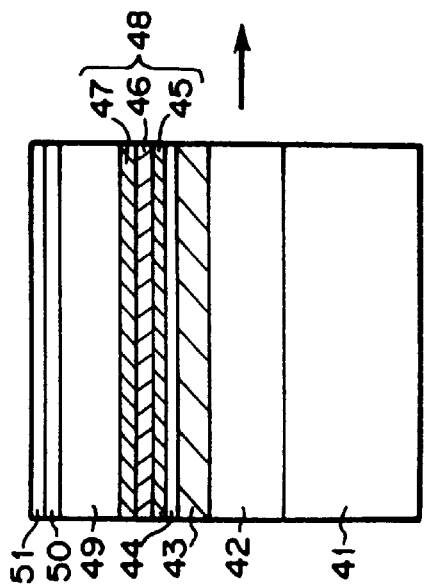
Figure 2E:
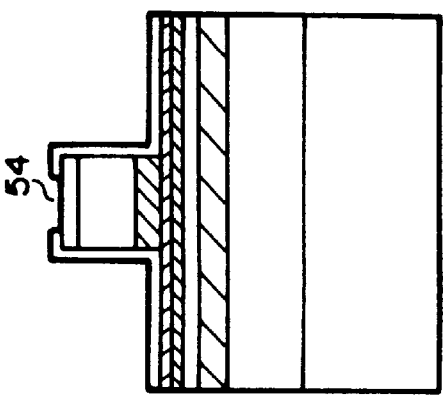
Figure 2F:
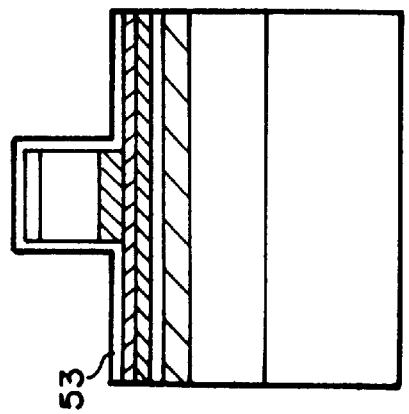

Thereafter an insulating layer 53 is formed over the exposed area of the second optical waveguide layer 46 and the ridge stripe 52 as shown in FIG. 2D, and then the insulating layer 53 on the upper surface of the ridge stripe 52 is removed by ordinary lithography, thereby forming a current injection window 54 as shown in FIG. 2E. A p-side electrode 55 is formed to cover the current injection window 54 and an n-side electrode 56 is formed on the lower surface of the substrate 41 after grinding the lower surface of the substrate 41 as shown in FIG. 2F. Then a high reflective coating is formed on one surface of the resonator and a low reflecting coating is formed on the other surface of the resonator, the surfaces being formed by cleavage. Then the resultant product is made into a semiconductor laser chip.

Since not including Al in the active layer 44, the semiconductor laser of this embodiment is better in durability. Further by virtue of the p-$Ga_{1-z1}Al_{z1}As$ optical waveguide layer 46 provided on the p-type clad layer 49 side of the active layer 44 of $In_{x3}Ga_{1-x3}As_{1-y3}P_{y3}$, overflow of electrons can be suppressed and positive holes can be more efficiently injected. Accordingly heat generation of the semiconductor laser can be reduced, and the semiconductor laser can emit 0.8 $\mu$m band laser beam at a high power keeping the fundamental transverse mode.

As a modification of the second embodiment, an $In_{0.5}(Ga_{1-z4}Al_{z4})_{0.5}P$ clad layer may be employed in place of the n-$Ga_{1-z5}Al_{z5}As$ clad layer 42.

The structure of a semiconductor laser in accordance with a third embodiment of the present invention will be described in conjunction with the procedure of forming the semiconductor laser shown in FIGS. 3A to 3F, hereinbelow. The semiconductor laser of this embodiment is substantially the same in the arrangement of layers as the first embodiment but differs from the same in that it is provided with an embedded index optical waveguide structure. The layers analogous to those in the first embodiment are given the same reference numerals and will not be described here.

In this embodiment, a ridge stripe 11 is formed by the same procedure as in the first embodiment. (FIGS. 3A to 3C)

Then an n-$In_{0.5}(Ga_{1-z3}Al_{z3})_{0.5}P$ current throttling layer 20 and a p-GaAs layer 21 are formed in this order on the exposed part of the first optical waveguide layer 5 on opposite sides of the stripe ridge 11 using the stripe 10a of the insulating layer 10 as a mask as shown in FIG. 3D. The composition of the current blocking layer 20 is selected so that the refractive index to light at the oscillation wavelength of the current blocking layer 20 is smaller than that of the p-type clad layer 8. Thereafter the stripe 10a of the insulating layer 10 is removed as shown in FIG. 3E. Then a p-GaAs contact layer 92 is formed on the exposed cap layer 9 and the p-GaAs layer 21 on opposite sides of the cap layer 9 and a p-side electrode 93 is formed on the p-GaAs contact layer 92. An n-side electrode 15 is formed on the lower surface of the substrate 1 after grinding the lower surface of the substrate 1 as shown in FIG. 3F. Then a high reflective coating is formed on one surface of the resonator and a low reflecting coating is formed on the other surface of the resonator, the surfaces being formed by cleavage. Then the resultant product is made into a semiconductor laser chip.

In this manner, there can be obtained a semiconductor laser having an embedded index waveguide structure which can emit a laser beam at a high power keeping a single transverse mode.

In the same manner, an embedded type semiconductor laser having the same layer arrangement as the aforesaid modification of the second embodiment can be produced. In this case, the composition of the n-$In_{0.5}(Ga_{1-z3}Al_{z3})_{0.5}P$ current blocking layer 20 is selected so that z3>z4 and the refractive index to light at the oscillation wavelength of the current blocking layer 20 is smaller than that of the p-type clad layer 8.

In the semiconductor lasers in accordance with the embodiments described above, by controlling the composition of the $In_{x3}Ga_{1-x3}As_{1-y3}P_{y3}$ active layer and the like, the oscillation wavelength can be controlled in the range of 750 nm to 1100 nm.

Further though in the embodiments described above, the present invention is applied to an index optical waveguide semiconductor laser which oscillates in a fundamental transverse mode, the present invention can be applied also to a multimode index optical waveguide semiconductor laser having a wide stripe.

The semiconductor layer growth may be effected also by a molecular beam epitaxial growth method using solid or gaseous raw materials.

The semiconductor laser of the present invention can be employed for high speed information/image processing, or as a light source in the field of communication, measurement, medical care, printing and the like.

What is claimed is:

1. An index optical waveguide semiconductor laser comprising a lower clad layer, a lower optical waveguide layer, an active layer, an upper optical waveguide layer and an upper clad layer superposed one on another in this order on a GaAs substrate, wherein the improvement comprises that
   each of the upper and lower clad layers and the upper and lower optical waveguide layers is of a composition which matches with the GaAs substrate in lattice,
   the upper optical waveguide layer comprises an $In_{x2}(Al_{z2}Ga_{1-z2})_{1-x2}As_{1-y2}P_{y2}$ ($1 \geq y2 \geq 0.8$) optical waveguide layer and a $Ga_{1-z1}Al_{z1}As$ optical waveguide layer formed on the upper surface of the $In_{x2}(Al_{z2}Ga_{1-z2})_{1-x2}Ax_{1-y2}P_{y2}$ optical waveguide layer, and
   the difference in the refractive index to light at the oscillation wavelength of the semiconductor laser between the $In_{x2}(Al_{z2}Ga_{1-z2})_{1-x2}As_{1-y2}P_{y2}$ optical waveguide layer and the $Ga_{1-z1}Al_{z1}As$ optical waveguide layer is not larger than 2% of the larger of the refractive indexes of the optical waveguide layers.

2. An index optical waveguide semiconductor laser as defined in claim 1 in which the active layer is of $In_{x3}Ga_{1-x3}As_{1-y3}P_{y3}$, the lower clad layer is of an n-type and the upper clad layer is of a p-type.

3. An index optical waveguide semiconductor laser as defined in claim 1 in which the total thickness of the upper and lower optical waveguide layers is 0.6 $\mu$m to 1.6 $\mu$m.

4. An index optical waveguide semiconductor laser as defined in claim 1 in which the upper and lower optical waveguide layers is of substantially the same thickness.

5. An index optical waveguide semiconductor laser as defined in claim 1 in which the difference in the refractive index to light at the oscillation wavelength of the semiconductor laser between the upper and lower clad layers is not larger than 2% of the larger of the refractive indexes of the clad layers.

6. An index optical waveguide semiconductor laser comprising a lower clad layer, a lower optical waveguide layer, an active layer, an upper optical waveguide layer and an upper clad layer superposed one on another in this order on a GaAs substrate, wherein the improvement comprises that each of the upper and lower clad layers and the upper and lower optical waveguide layers is of a composition which matches with the GaAs substrate in lattice, the upper optical waveguide layer comprises a $Ga_{1-z1}Al_{z1}As$ optical waveguide layer and an $In_{x6}(Al_{z6}Ga_{1-z6})_{1-x6}P$ optical waveguide layer formed on the upper surface of the $Ga_{1-z1}Al_{z1}As$ optical waveguide layer, and the difference in the refractive index to light at the oscillation wavelength of the semiconductor laser between the $Ga_{1-z1}Al_{z1}As$ optical waveguide layer and the $In_{x6}(Al_{z6}Ga_{1-z6})_{1-x6}P$ optical waveguide layer is not larger than 2% of the larger of the refractive indexes of the optical waveguide layers.

7. An index optical waveguide semiconductor laser as defined in claim 6 in which the active layer is of $In_{x3}Ga_{1-x3}As_{1-y3}P_{y3}$, the lower clad layer is of an n-type and the upper clad layer is of a p-type.

8. An index optical waveguide semiconductor laser as defined in claim 6 in which the total thickness of the upper and lower optical waveguide layers is 0.6 $\mu$m to 1.6 $\mu$m.

9. An index optical waveguide semiconductor laser as defined in claim 6 in which the upper and lower optical waveguide layers is of substantially the same thickness.

10. An index optical waveguide semiconductor laser as defined in claim 6 in which the difference in the refractive index to light at the oscillation wavelength of the semiconductor laser between the upper and lower clad layers is not larger than 2% of the larger of the refractive indexes of the clad layers.

11. An index optical waveguide semiconductor laser comprising a lower clad layer, a lower optical waveguide layer, an active layer, an upper optical waveguide layer and an upper clad layer superposed one on another in this order on a GaAs substrate, wherein the improvement comprises that each of the upper and lower clad layers and the upper and lower optical waveguide layers is of a composition which matches with the GaAs substrate in lattice, the upper optical waveguide layer comprises an $In_{x2}(Al_{z2}Ga_{1-z2})_{1-x2}As_{1-y2}P_{y2}$ ($1 \geq y2 \geq 0.8$) optical waveguide layer, a $Ga_{1-z1}Al_{z1}As$ optical waveguide layer formed on the upper surface of the $In_{x2}(Al_{z2}Ga_{1-z2})_{1-x2}As_{1-y2}P_{y2}$ optical waveguide layer, and an $In_{x6}(Al_{z6}Ga_{1-z6})_{1-x6}P$ optical waveguide layer formed on the upper surface of the $Ga_{1-z1}Al_{z1}As$ optical waveguide layer, the difference in the refractive index to light at the oscillation wavelength of the semiconductor laser among the $In_{x2}(Al_{z2}Ga_{1-z2})_{1-x2}As_{1-y2}P_{y2}$ optical waveguide layer, the $Ga_{1-z1}Al_{z1}As$ optical waveguide layer and the $In_{x6}(Al_{z6}Ga_{1-z6})_{1-x6}P$ optical waveguide layer is not larger than 2% of the largest of the refractive indexes of the three optical waveguide layers.

12. An index optical waveguide semiconductor laser as defined in claim 11 in which the active layer is of $In_{x3}Ga_{1-x3}As_{1-y3}P_{y3}$, the lower clad layer is of an n-type and the upper clad layer is of a p-type.

13. An index optical waveguide semiconductor laser as defined in claim 11 in which the total thickness of the upper and lower optical waveguide layers is 0.6 $\mu$m to 1.6 $\mu$m.

14. An index optical waveguide semiconductor laser as defined in claim 11 in which the upper and lower optical waveguide layers is of substantially the same thickness.

15. An index optical waveguide semiconductor laser as defined in claim 11 in which the difference in the refractive index to light at the oscillation wavelength of the semiconductor laser between the upper and lower clad layers is not larger than 2% of the larger of the refractive indexes of the clad layers.

* * * * *